(12) United States Patent
Hsu et al.

(10) Patent No.: US 11,621,221 B2
(45) Date of Patent: Apr. 4, 2023

(54) BALL GRID ARRAY PACKAGE AND PACKAGE SUBSTRATE THEREOF

(71) Applicant: REALTEK SEMICONDUCTOR CORP., Hsinchu (TW)

(72) Inventors: Che-Ming Hsu, Hsinchu (TW); Sung-Yuan Lin, Hsinchu (TW); Nai-Jen Hsuan, Hsinchu (TW); Yu-Hsin Wang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 38 days.

(21) Appl. No.: 17/317,343

(22) Filed: May 11, 2021

(65) Prior Publication Data

US 2022/0139817 A1 May 5, 2022

(30) Foreign Application Priority Data

Nov. 4, 2020 (TW) ................................. 109138492

(51) Int. Cl.
*H01L 23/498* (2006.01)
(52) U.S. Cl.
CPC .. *H01L 23/49838* (2013.01); *H01L 23/49816* (2013.01)
(58) Field of Classification Search
CPC ............... H01L 23/49838; H01L 23/49816
See application file for complete search history.

(56) References Cited

U.S. PATENT DOCUMENTS

| 2013/0134579 | A1* | 5/2013 | Howard | .................. H01L 24/06 |
| | | | | 257/737 |
| 2016/0358866 | A1* | 12/2016 | Zu | ........................... H01L 23/50 |
| 2018/0368260 | A1 | 12/2018 | Fan et al. | |
| 2020/0303330 | A1* | 9/2020 | Lin | ......................... H01L 23/66 |

FOREIGN PATENT DOCUMENTS

| TW | 200631064 A | 9/2006 |
| TW | 201711151 A | 3/2017 |
| TW | 201935644 A | 9/2019 |

\* cited by examiner

*Primary Examiner* — Benjamin Tzu-Hung Liu
(74) *Attorney, Agent, or Firm* — Birch, Stewart, Kolasch & Birch, LLP

(57) ABSTRACT

A package substrate is adapted to a ball grid array package. The substrate includes two substrate contacts, two solder ball pads, two via holes and two signal lines. A connection line of the two substrate contacts is substantially perpendicular to a connection line of the two solder ball pads. The two substrate contacts are respectively connected to the two via holes by the two signal lines. Each signal line includes a circuit trace section, an approaching section and a bifurcating section connected in sequence. The two circuit trace sections of each signal line are substantially arranged in parallel. The two approaching sections are substantially arranged in parallel and substantially symmetrical about the connection line of the solder ball pads. The two bifurcating sections are substantially symmetrical about the pad connection line and respectively electrically connected to the two via holes.

20 Claims, 7 Drawing Sheets

BALL GRID ARRAY PACKAGE AND PACKAGE SUBSTRATE THEREOF

CROSS-REFERENCE TO RELATED APPLICATION

This non-provisional application claims priority under 35 U.S.C. § 119(a) to Patent Application No. 109138492 filed in Taiwan, R.O.C. on Nov. 4, 2020, the entire contents of which are hereby incorporated by reference.

BACKGROUND

Technical Field

The present invention relates to a package substrate, and in particular, to a substrate for a ball grid array package and the ball grid array package.

Related Art

Ball grid array package is one of surface-mount packaging technologies used for packaging chips (integrated circuits) on a circuit board. The circuit board has a plurality of solder balls arranged as an array, a plurality of contacts for electrically connecting chips, and a plurality of circuit traces for respectively electrically connecting the contacts with the solder balls. Design requirements of a circuit trace used for transmitting a differential signal is higher than design requirements of a circuit trace used for transmitting other signals.

US Patent Application No. 2016/0358866, filed on Dec. 8, 2016 and entitled "PACKAGE SUBSTRATE DIFFERENTIAL IMPEDANCE OPTIMIZATION FOR 25 G BPS AND BEYOND" and US Patent Application No. 2018/0368260, filed on Dec. 20, 2018 and entitled "HIGH-SPEED PRINTED CIRCUIT BOARD AND DIFFERENTIAL WIRING METHOD THEREOF" describe design requirements of a differential signal circuit trace. The differential signal circuit trace often needs to overcome the signal delay problem of a pair of differential signals caused by the length difference of the positive and negative circuit traces, the differential reflection loss and the differential insertion loss.

SUMMARY

In view of this, according to some embodiments, a ball grid array package includes a chip and a substrate. The chip includes two chip contacts. The substrate includes two substrate contacts, two solder ball pads, two via holes and two signal lines. A connection line of the two substrate contacts is a contact connection line, and the two chip contacts are electrically connected to the two substrate contacts. A connection line of the two solder ball pads is a pad connection line, and the contact connection line is insubstantially parallel to the pad connection line. The two via holes are substantially symmetrical about the pad connection line, and the two via holes are respectively electrically connected to the two solder ball pads. Each signal line includes a circuit trace section, an approaching section and a bifurcating section connected in sequence, the two circuit trace sections are respectively electrically connected to the two substrate contacts and substantially arranged in parallel, the two approaching sections are substantially arranged in parallel and substantially symmetrical about the pad connection line, and the two bifurcating sections are substantially symmetrical about the pad connection line and respectively electrically connected to the two via holes.

According to some embodiments, a distance from a joint of the bifurcating section and the approaching section of each of the two signal lines to the solder ball pad is 100 microns (μm) to 250 μm.

According to some embodiments, where lengths of the two bifurcating sections are substantially identical.

According to some embodiments, each of the two bifurcating sections includes an inclined subsection and a straight subsection, the two inclined subsections are respectively electrically connected to the two approaching sections, and the two straight subsections are substantially parallel to the pad connection line and respectively electrically connected to the two via holes.

According to some embodiments, each of the two bifurcating sections sequentially includes an inclined subsection, a straight subsection and an introduction subsection, the two inclined subsections are respectively electrically connected to the two approaching sections, the two straight subsections are substantially parallel to the pad connection line, and the two introduction subsections are respectively electrically connected to the two via holes.

According to some embodiments, an included angle between each of the two inclined subsections and the pad connection line is between 35 degrees and 55 degrees, a distance between each of the two inclined subsections and the adjacent solder ball pad is 50 μm to 150 μm, a distance between each of the two straight subsections and the adjacent solder ball pad is 50 μm to 150 μm, and an outer diameter of each of the two solder balls pad is 300 μm to 600 μm.

According to some embodiments, the two signal lines have a preset impedance, and there is a predetermined relationship between a length of each of the two bifurcating sections and a distance between the two via holes, where the predetermined relationship makes an impedance of the two via holes be lower than the preset impedance and an impedance of the two bifurcating sections be higher than the preset impedance.

According to some embodiments, a package substrate is adapted to package a chip, and the chip has two chip contacts. The package substrate includes two substrate contacts, two solder ball pads, two via holes and two signal lines. A connection line of the two substrate contacts is a contact connection line, and the two substrate contacts are adapted to electrically connect to the two chip contacts. A connection line of the two solder ball pads is a pad connection line, and the contact connection line is insubstantially parallel to the pad connection line. The two via holes are substantially symmetrical about the pad connection line, and the two via holes are respectively electrically connected to the two solder ball pads. Each signal line includes a circuit trace section, an approaching section and a bifurcating section connected in sequence, the two circuit trace sections are respectively electrically connected to the two substrate contacts and substantially arranged in parallel, the two approaching sections are substantially arranged in parallel and substantially symmetrical about the pad connection line, and the two bifurcating sections are substantially symmetrical about the pad connection line and respectively electrically connected to the two via holes.

In conclusion, according to some embodiments, a differential signal line of a package substrate includes bifurcating sections. The bifurcating sections are symmetrical about a pad connection line and electrically connected to via holes, and the via holes are symmetrical about the pad connection line. Therefore, lengths of two signal lines in the same pair of differential signal lines are substantially the same, and a time difference in differential signal transmission is reduced. In some embodiments, an impedance of the differential signal line can be closer to a design impedance by adjusting a relationship between a length of the bifurcating section and a fifth distance.

DETAILED DESCRIPTION

Figure 1A:
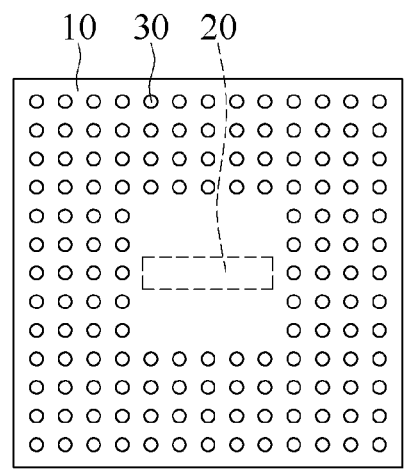
FIG. 1A is a bottom view of a ball grid array package according to some embodiments.
Figure 1B:
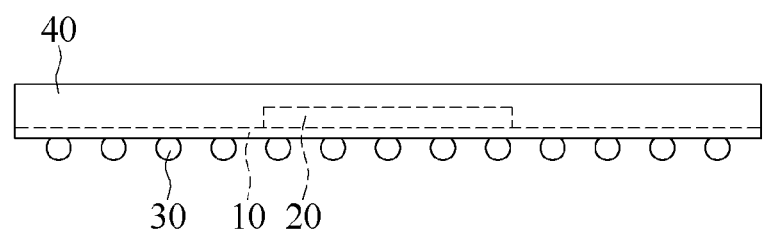
FIG. 1B is a side view of the ball grid array package shown in FIG. 1A.

FIG. 1A is a bottom view of a ball grid array package according to some embodiments. FIG. 1B is a side view of the ball grid array package shown in FIG. 1A. A ball grid array package (BGA package) includes a substrate 10, a chip 20, a solder ball 30 and a cover body 40. The substrate 10 has circuit traces used for respectively electrically connecting a plurality of contacts (to be described later) of the chip 20 to a plurality of solder balls 30. The cover body 40 covers the chip 20 and the substrate 10, to protect the circuit traces on the chip 20 and the substrate 10. In some embodiments, contacts of the chip 20 are respectively electrically connected to corresponding circuit traces by wire bonds. In some embodiments, the chip 20 is a flip chip, and the chip 20 is electrically connected to corresponding circuit traces in a flip-chip manner. In some embodiments, the substrate 10 is a circuit board, the circuit board may be a multi-layer circuit board, for example, but not limited to a four-layer circuit board or a six-layer circuit board, and a quantity of layers of the circuit board is designed according to characteristics and a quantity of the contacts of the chip 20. In some embodiments, a material of the cover body 40 is metal, plastic, glass or ceramic.

Figure 2:
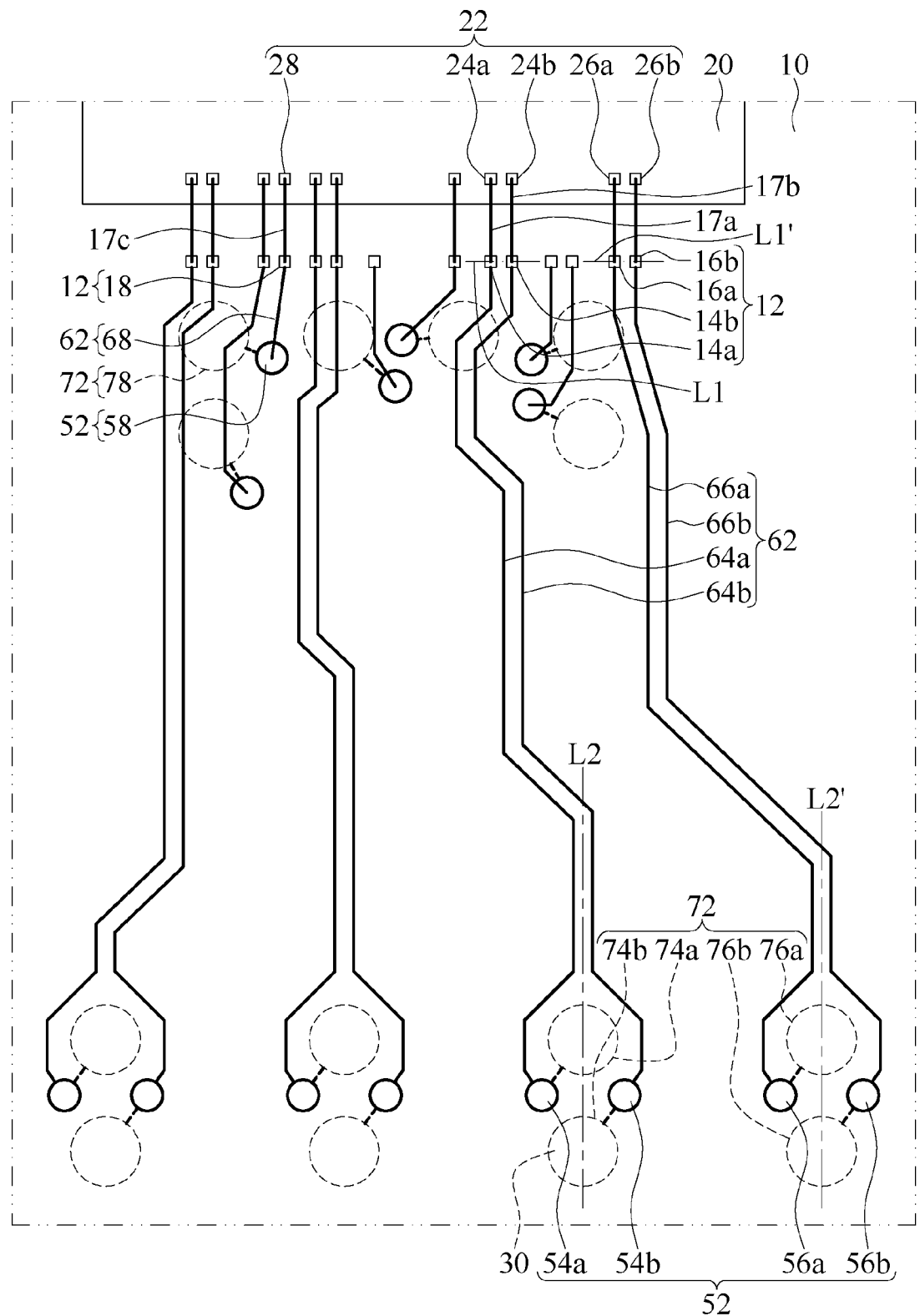
FIG. 2 is a partial top view of a chip, a circuit trace and a solder ball pad that are of a ball grid array package according to some embodiments (a cover body is not shown)

FIG. 2 is a partial top view of a chip, a circuit trace and a solder ball pad of a ball grid array package according to some embodiments (only a part of the chip, a part of the circuit trace and a part of the solder ball pad are shown, and the cover body 40 is not shown). The chip 20 includes a plurality of chip contacts 22. In some embodiments, the chip contacts 22 include differential chip contacts 24a, 24b, 26a, 26b and ordinary chip contacts 28. The differential chip contacts 24a and 24b are hereinafter referred to as a first pair of differential chip contacts, which are respectively a positive end contact and a negative end contact, and are configured to transmit differential signals; and the differential chip contacts 26a and 26b are hereinafter referred to as a second pair of differential chip contacts, and are configured to transmit differential signals. The ordinary chip contacts 28 may be an output contact, an input contact or a detection contact.

The substrate 10 includes a plurality of substrate contacts 12. In some embodiments, the substrate contacts 12 include differential substrate contacts 14a, 14b, 16a, 16b and ordinary substrate contacts 18 (the differential substrate contacts 14a and 14b are hereinafter referred to as a first pair of differential substrate contacts; and the differential substrate contacts 16a and 16b are hereinafter referred to as a second pair of differential substrate contacts).

The substrate contacts 12 are respectively and correspondingly electrically connected to the chip contacts 22. In the embodiments of FIG. 2, the substrate contacts 12 are electrically connected to the corresponding chip contacts 22 through differential wire bonds 17a, 17b and ordinary wire bonds 17c respectively. The differential wire bonds 17a, 17b are wire bonds configured to connect the differential substrate contacts 14a, 14b, 16a and 16b to the differential chip contacts 24a, 24b, 26a and 26b. The ordinary wire bonds 17c are wire bonds configured to respectively connect the ordinary substrate contact 18 to the corresponding ordinary chip contacts 28.

The substrate 10 includes a plurality of via holes 52. In some embodiments, the via holes 52 include differential via holes 54a, 54b, 56a, 56b and ordinary via holes 58 (the differential via holes 54a and 54b are hereinafter referred to as a first pair of differential via holes; and the differential via holes 56a and 56b are hereinafter referred to as a second pair of differential via holes).

The substrate 10 includes a plurality of signal lines 62 (i.e., the foregoing circuit traces), and the signal lines 62 are configured to respectively electrically connect the substrate contacts 12 to the via holes 52. In some embodiments, the signal lines 62 include differential signal lines 64a, 64b, 66a, 66b and ordinary signal lines 68 (the differential signal lines 64a and 64b are hereinafter referred to as a first pair of differential signal lines; and the differential signal lines 66a and 66b are hereinafter referred to as a second pair of differential signal lines).

The substrate 10 includes a plurality of solder ball pads 72 (circles formed by dashed lines shown in the figure), and the solder ball pad 72 are respectively electrically connected to the via holes 52. In some embodiments, the solder ball pad 72 includes differential solder ball pads 74a, 74b, 76a, 76b and ordinary solder ball pads 78 (the differential solder ball pads 74a and 74b are hereinafter referred to as a first pair of differential solder ball pads; and the differential solder ball pads 76a and 76b are hereinafter referred to as a second pair of differential solder ball pads).

A connection line of the first pair of differential substrate contacts 14a and 14b is referred to as a contact connection line L1 (L1 is a virtual connection line, and is roughly in a horizontal direction in the figure, and the contact connection line L1 includes an extension line that extends beyond the first pair of differential substrate contacts 14a and 14b). In some embodiments, the contact connection line L1 is a connection line of a positive end differential substrate contact 14a and a negative end differential substrate contact 14b of the first pair of differential substrate contacts 14a and 14b at a corresponding portion. For example, the contact connection line L1 is, but not limited to, a connection line (as shown in FIG. 2) between centers of the positive end differential substrate contact 14a and the negative end differential substrate contact 14b; a connection line between vertexes of the positive end differential substrate contact 14a and the negative end differential substrate contact 14b; or a connection line between bottom points of the positive end differential substrate contact 14a and the negative end differential substrate contact 14b. A connection line of the first pair of differential solder ball pads 74a and 74b is referred to as a pad connection line L2 (L2 is a virtual connection line, and is roughly in a vertical direction in the figure, and the pad connection line L2 includes an extension line that extends beyond the first pair of differential solder ball pads 74a and 14b). In some embodiments, the pad connection line L2 is a connection line of a positive end differential solder ball pad 74a and a negative end differential solder ball pad 74b of the first pair of solder ball pads 74a and 74b at a corresponding portion. For example, the pad connection L2 is, but not limited to, a connection line (as shown in FIG. 2) between centers of the positive end differential solder ball pad 74a and the negative end differential solder ball pad 74b; or a connection line between the same quadrant point of the positive end differential solder ball pad 74a and the negative end differential solder ball pad 74b. In the embodiments of FIG. 2, the contact connection line L1 is insubstantially parallel to the pad connection line L2. In some embodiments, an insubstantially parallel relationship between the contact connection line L1 and the pad connection line L2 is a substantial vertical relationship (as shown in FIG. 2), or an included angle between the contact connection line L1 and the pad connection line L2 is substantially 45 degrees, or between 45 degrees and 90 degrees ("insubstantially parallel" is to be described later). In some embodiments, the first pair of differential solder ball pads 74a and 74b are close to one side (a lower boundary in the embodiments of FIG. 2) of the substrate 10, and the pad connection line L2 is substantially perpendicular to the side. In the embodiments of FIG. 2, the first pair of differential solder ball pads 74a and 74b are close to a bottom edge (that is, a below edge of FIG. 2 corresponding to a lower boundary of the substrate in FIG. 1A) of the substrate 10. In some embodiments, a pad connection line L2' of the second pair of differential solder ball pads 76a and 76b is insubstantially parallel to a contact connection line L1' of the second pair of differential substrate contacts 16a and 16b.

A configuration position of at least one pair of the foregoing differential via holes 54a, 54b, 56a and 56b is substantially symmetrical about the corresponding pad connection line L2 and L2'. In the embodiments of FIG. 2, the first pair of the differential via holes 54a and 54b are symmetrical about the pad connection line L2, and the second pair of the differential via holes 56a and 56b are symmetrical about the pad connection line L2'.

Figure 3:
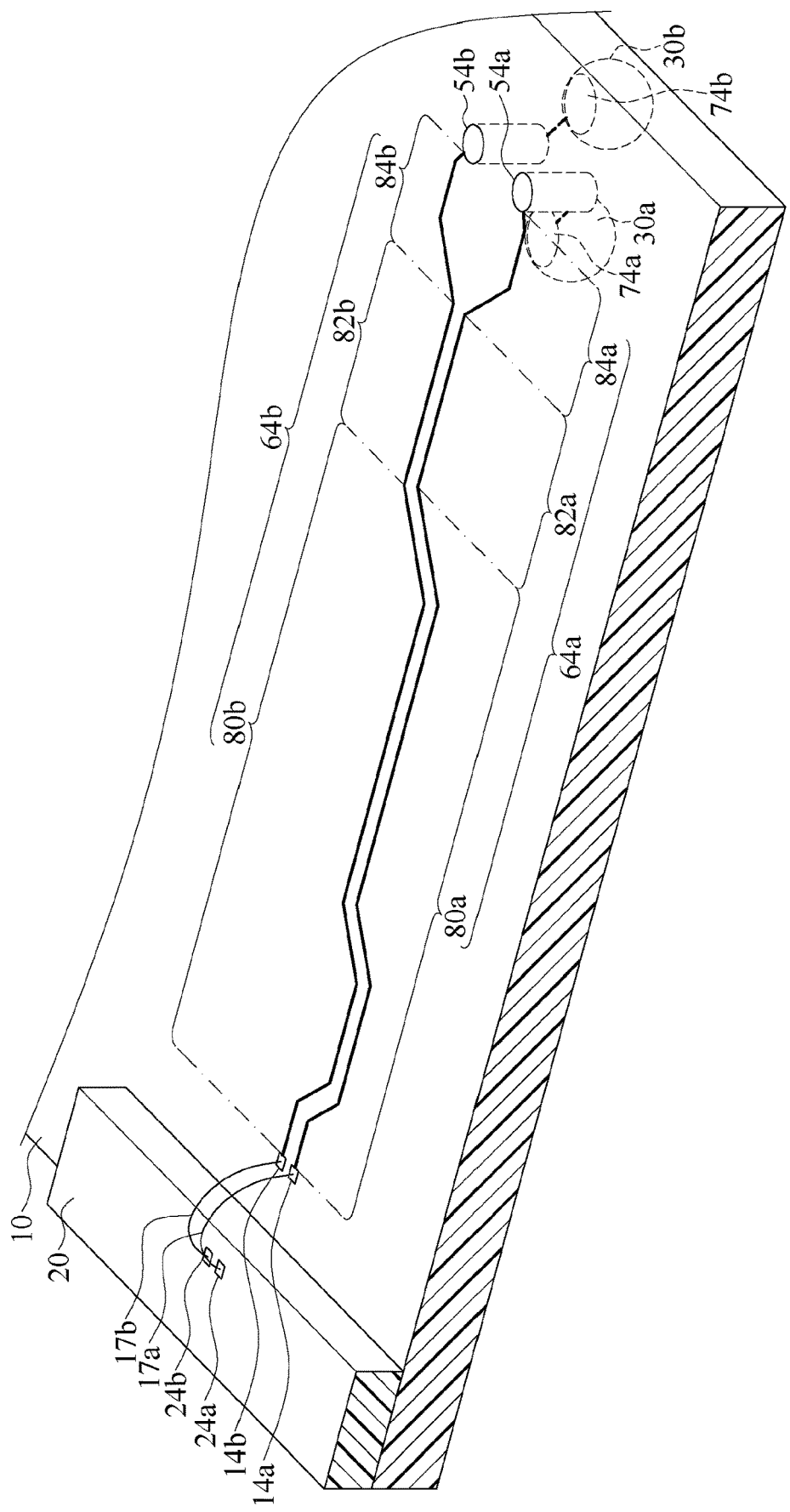
FIG. 3 is a partial schematic three-dimensional diagram of a chip, a pair of differential signal lines and a solder ball pad that are of a ball grid array package according to some embodiments (only a pair of differential signal lines are shown)

FIG. 3 is a partial schematic three-dimensional diagram of a chip, a pair of differential signal lines and a solder ball pad that are of a ball grid array package according to some embodiments (only a pair of differential signal lines are shown). FIG. 3 shows a first pair of differential chip contacts 24a and 24b, a first pair of differential substrate contacts 14a and 14b, a first pair of differential signal lines 64a and 64b, a first pair of differential via holes 54a and 54b, and a first pair of differential solder ball pads 74a and 74b (the first pair of differential signal lines 64a and 64b are used for description below, and corresponding component names are not described by the "first pair" for brevity). It can be seen from FIG. 3, the substrate 10 is a multilayer board, the differential substrate contacts 14a and 14b and the differential signal lines 64a and 64b are located at a top layer of the substrate 10, the differential solder ball pads 74a and 74b are located at a bottom layer of the substrate 10, the differential signal lines 64a and 64b are electrically connected to the differential via holes 54a and 54b, and the differential via holes 54a and 54b are electrically connected to the top layer and the bottom layer, and are electrically connected to the differential solder ball pads 74a and 74b located at the bottom layer. In addition, solder balls 30a and 30b are electrically connected to the corresponding differential solder ball pads 74a and 74b.

The differential signal line 64a includes a circuit trace section 80a, an approaching section 82a and a bifurcating section 84a electrically connected in sequence. The differential signal line 64b includes a circuit trace section 80b, an approaching section 82b and a bifurcating section 84b electrically connected in sequence. Two ends of the differential signal line 64a are respectively electrically connected to the differential substrate contact 14a and the differential via hole 54a. Two ends of the differential signal line 64b are respectively electrically connected to the differential substrate contact 14b and the differential via hole 54b. That is, one end of the circuit trace section 80a and one end of the circuit trace section 80b are respectively electrically connected to the differential substrate contacts 14a and 14b. One end of the bifurcating section 84a and one end of the bifurcating section 84b are respectively electrically connected to the differential via holes 54a and 54b.

The circuit trace sections 80a and 80b are substantially arranged in parallel. Therefore, lengths of the two circuit trace sections 80a and 80b are substantially identical. In some embodiments, each of the circuit trace sections 80a and 80b includes a plurality of turns. A quantity of turns and an angle of a turn depend on requirements of the entire circuit traces of the substrate 10. The circuit trace sections 80a and 80b turn into the approaching sections 82a and 82b at an appropriate distance the differential solder ball pads 74a and 74b. The approaching sections 82a and 82b are substantially arranged in parallel and are substantially symmetrical about the pad connection line L2 (see FIG. 2). Therefore, lengths of the two approaching sections 82a and 82b are substantially identical. In some embodiments, lengths of each pair of approaching sections 82a and 82b are substantially different (as shown in FIG. 2, lengths of the approaching sections 82a and 82b of the first pair of differential signal lines 64a and 64b are different from lengths of the approaching sections of the second pair of differential signal lines 66a and 66b). In some embodiments, lengths of each pair of approaching sections 82a and 82b are substantially identical. When the approaching sections 82a and 82b are at a predetermined distance (to be described later) from the differential solder ball pads 74a and 74b, the two approaching sections 82a and 82b respectively turn into the bifurcating sections 84a and 84b. The bifurcating sections 84a and 84b are substantially symmetrical about the pad connection line L2, and lengths of the bifurcating sections 84a and 84b are substantially identical. Therefore, lengths of the differential signal lines 64a and 64b are substantially identical. As a result, a time for transmitting the differential signal between the differential substrate contacts 14a and the differential via holes 54a is identical to a time for transmitting the differential signal between the differential substrate contacts 14b and the differential via holes 54b. Quality of the differential signal transmission is correspondingly improved. In some embodiments, the foregoing symmetry may be at least one of length symmetry, width symmetry, and shape symmetry.

Figure 4:
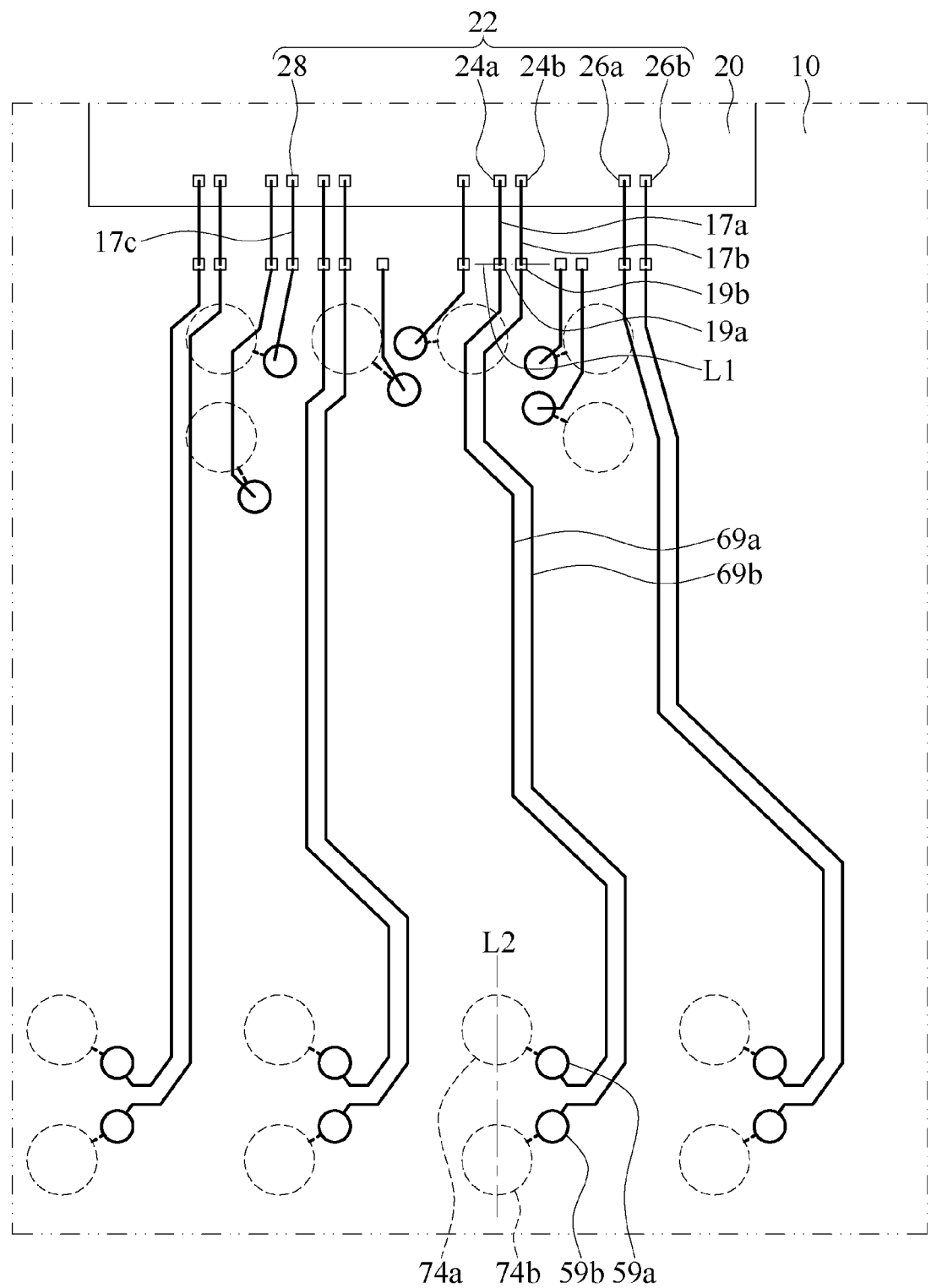
FIG. 4 is a partial schematic diagram of a chip, a circuit trace and a solder ball pad that are of a ball grid array package according to some embodiments.

Next, to describe signal transmission characteristics of the embodiments of FIG. 2, please refer to FIG. 4. FIG. 4 is a partial schematic diagram of a chip, a circuit trace, and a solder ball pad that are of a ball grid array package according to some embodiments. The embodiments of FIG. 4 are a ball grid array package of a previous generation made by the inventor, where differential signal lines 69a and 69b are used for respectively electrically connecting differential substrate contacts 19a and 19b to differential via holes 59a and 59b. In the embodiments of FIG. 4, the differential via holes 59a and 59b are located at the same side (that is, the right side of a pad connection line L2 in FIG. 4) of the pad connection line L2. The differential signal lines 69a and 69b do not have the approaching sections 82a and 82b and the bifurcating sections 84a and 84b of the embodiment of FIG. 3, but include larger turning angles to electrically connect to the differential via holes 59a and 59b. When an included angle between the contact connection line L1 and the pad connection line L2 is substantially 45 degrees, between 45 degrees to 90 degrees, or substantially 90 degrees (substantially perpendicular, as shown in the embodiments of FIG. 4) (that is, the foregoing insubstantially parallel), the turning angles of the differential signal lines 69a and 69b cause a length difference between the two differential signal lined 69a and 69b. The length difference makes worse differential signal transmission performance of the differential signal lines 69a and 69b than that of the embodiments of FIG. 2.

Figure 5:
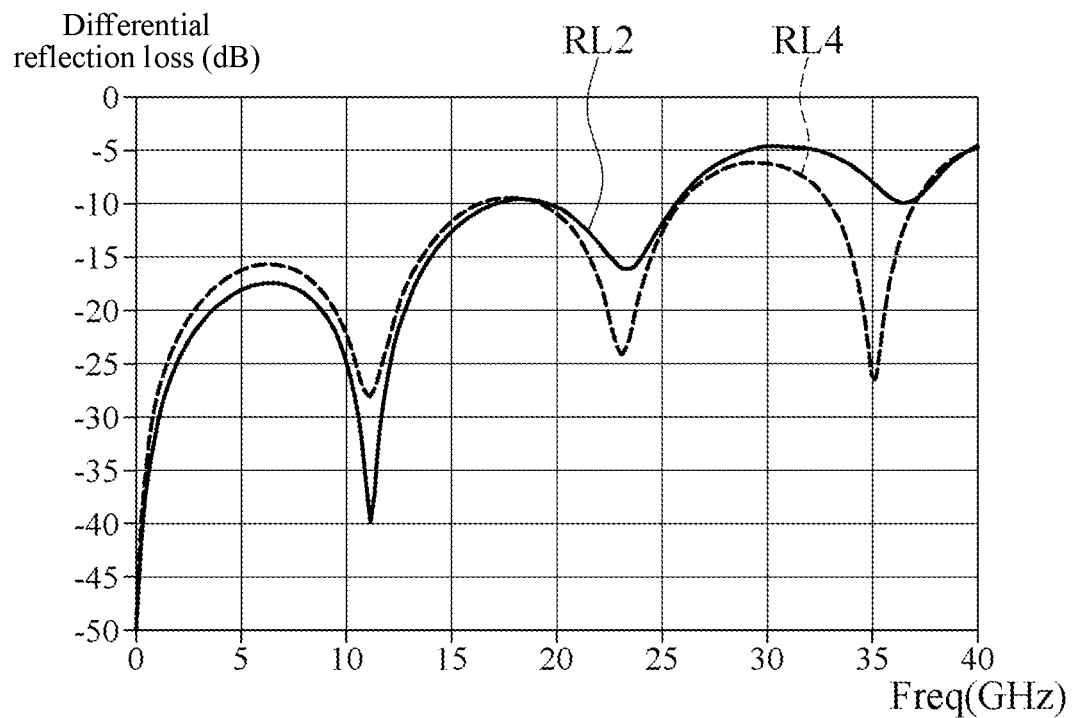
FIG. 5 is a differential reflection loss diagram of a pair of differential signal lines in FIG. 2 and FIG. 4.

FIG. 5 is a differential reflection loss diagram of a pair of differential signal lines in FIG. 2 and FIG. 4. A horizontal axial of the differential reflection loss diagram represents frequency with a unit of GHz ($10^9$ hertz, gigahertz); and a vertical axis represents differential reflection loss with a unit of dB (decibel). RL4 marked in FIG. 5 is a differential reflection loss curve RL4 of the differential signal lines 69a and 69b in FIG. 4. A differential signal is inputted from the differential chip contacts 24a and 24b of an end of the chip 20. Reflection signal strength is received from the differential chip contacts 24a and 24b, to obtain the differential reflection loss curve RL4. Similarly, RL2 marked in FIG. 5 is a differential reflection loss curve RL2 of the differential signal lines 64a and 64b in FIG. 2. A differential signal is inputted from the differential chip contacts 24a and 24b of an end of the chip 20. Reflection signal strength is received from the differential chip contacts 24a and 24b, to obtain the differential reflection loss curve RL2. It can be seen from the comparison in the figure that, when a signal frequency is less than about 18 GHz (corresponding to about 36 Gbps, $36 \times 10^9$ bit rates), the differential reflection loss curve RL2 of the embodiments of FIG. 2 is better than the differential reflection loss curve RL4 of the embodiments of FIG. 4. Therefore, in a case that the embodiments of FIG. 4 meet transmission requirements of the differential signal, the embodiments of FIG. 2 have better performance in the differential reflection loss on application with a rate less than about 36 Gbps.

Figure 6:
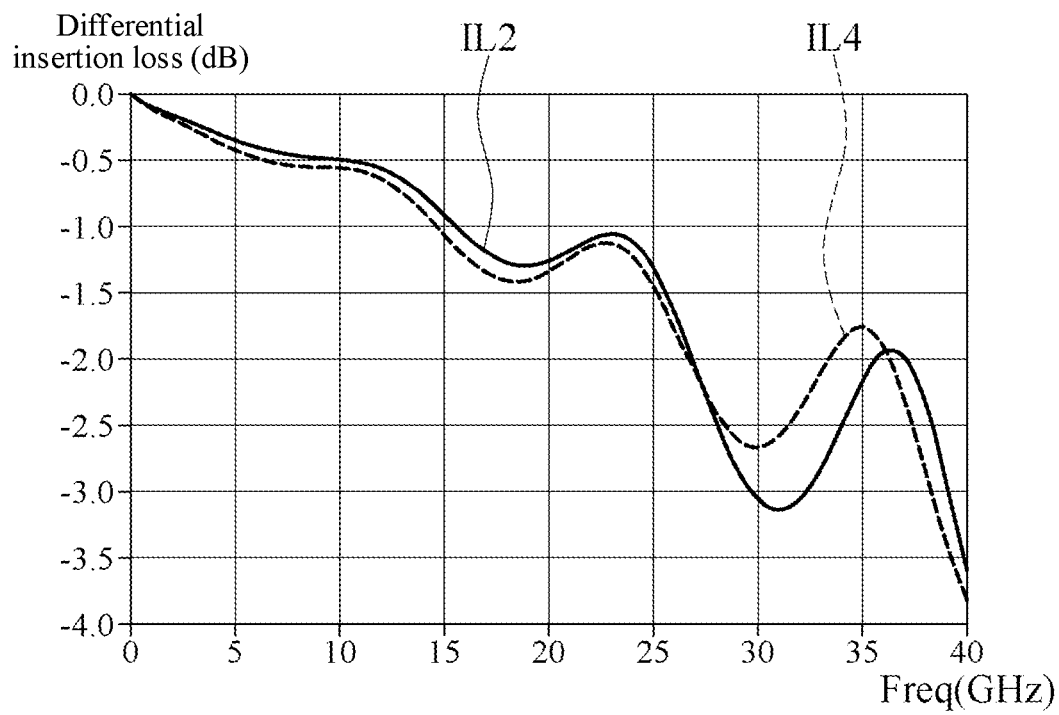
FIG. 6 is a differential insertion loss diagram of a pair of differential signal lines in FIG. 2 and FIG. 4.

FIG. 6 is a differential insertion loss diagram of a pair of differential signal lines in FIG. 2 and FIG. 4. A horizontal axial of the differential insertion loss diagram represents frequency with a unit of GHz; and a vertical axis represents differential insertion loss with a unit of dB. IL4 marked in FIG. 6 is a differential insertion loss curve IL4 of the differential signal lines 69a and 69b in FIG. 4. A differential signal is inputted from the differential chip contacts 24a and 24b of an end of the chip 20, and the differential signal is received from the solder balls 30a and 30b, to obtain the differential insertion loss curve IL4. Similarly, IL2 marked in FIG. 6 is a differential insertion loss curve IL2 of the differential signal lines 64a and 69b in FIG. 2. A differential signal is inputted from the differential chip contacts 24a and 24b of an end of the chip 20, and the differential signal is received from the solder balls 30a and 30b, to obtain the differential insertion loss curve IL2. It can be seen from the comparison in the figure that, when a signal frequency is less than about 27 GHz (corresponding to about 54 Gbps, $54 \times 10^9$ bit rates), the differential insertion loss curve IL2 of the embodiments of FIG. 2 is better than the differential insertion loss curve IL4 of the embodiments of FIG. 4. In comparison between FIGS. 2 and 4, the differential signal lines 69a and 69b of FIG. 4 do not include any single-ended signal line while the differential signal lines 64a and 64b of the embodiments of FIG. 2 include quasi-single-ended signal lines (the bifurcating sections 84a and 84b). It is normal that an effect of transmitting the differential signal by quasi-single-ended signal lines is usually poorer than that by differential signal lines. However, it can be known from the differential insertion loss diagram that the differential insertion loss curve IL2 of the differential signal lines 64a and 64b of the embodiments of FIG. 2 is still better than the differential insertion loss IL4 of the embodiments of FIG. 4 in transmitting the differential signal. Therefore, in a case that the embodiments of FIG. 4 meet transmission requirements of the differential signal, the embodiments of FIG. 2 have better performance in the differential insertion loss on application with a rate less than about 54 Gbps.

Figure 7:
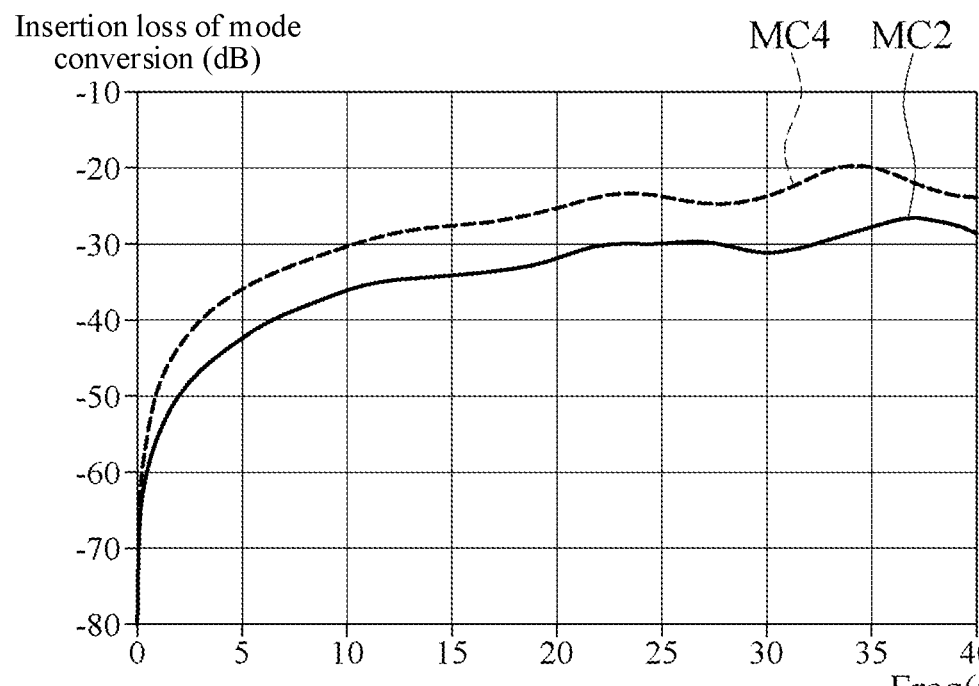
FIG. 7 is an insertion loss diagram of transferring a differential-mode signal of mode conversion of a pair of differential signal lines in FIG. 2 and FIG. 4 to common-mode noise.

FIG. 7 is an insertion loss diagram of transferring a differential-mode signal of mode conversion of a pair of differential signal lines in FIG. 2 and FIG. 4 to common-mode noise. A horizontal axial of the insertion loss diagram represents frequency with a unit of GHz; and a vertical axis represents differential insertion loss of the mode conversion with a unit of dB. MC4 marked in FIG. 7 is an insertion loss curve MC4 of mode conversion of the differential signal lines 69a and 69b in FIG. 4. A differential-mode signal is inputted from the differential chip contacts 24a and 24b of an end of the chip 20, and the common-mode noise generated by the differential signal due to a circuit trace is received from the solder balls 30a and 30b, to obtain the insertion loss curve MC4 of the mode conversion. In FIG. 4, because the differential signal lines 69a and 69b have a relatively large turning angle, a symmetry of the positive end differential signal line 69a and the negative end differential signal line 69b is not good enough. The poor symmetry indirectly causes common-mode noise in differential signal transmission. MC2 marked in FIG. 7 is an insertion loss curve MC2 of mode conversion of the differential signal lines 64a and 64b in FIG. 2. A differential-mode signal is inputted from the differential chip contacts 24a and 24b of an end of the chip 20, and the common-mode noise generated by the differential signal due to a circuit trace is received from the solder balls 30a and 30b, to obtain the insertion loss curve MC2 of the mode conversion. It can be seen from the comparison in the figure that, the insertion loss curve MC2 of the mode conversion of the embodiments of FIG. 2 is about 6 dB better than the insertion loss curve MC4 of the mode conversion of the embodiments of FIG. 4.

Figure 8:
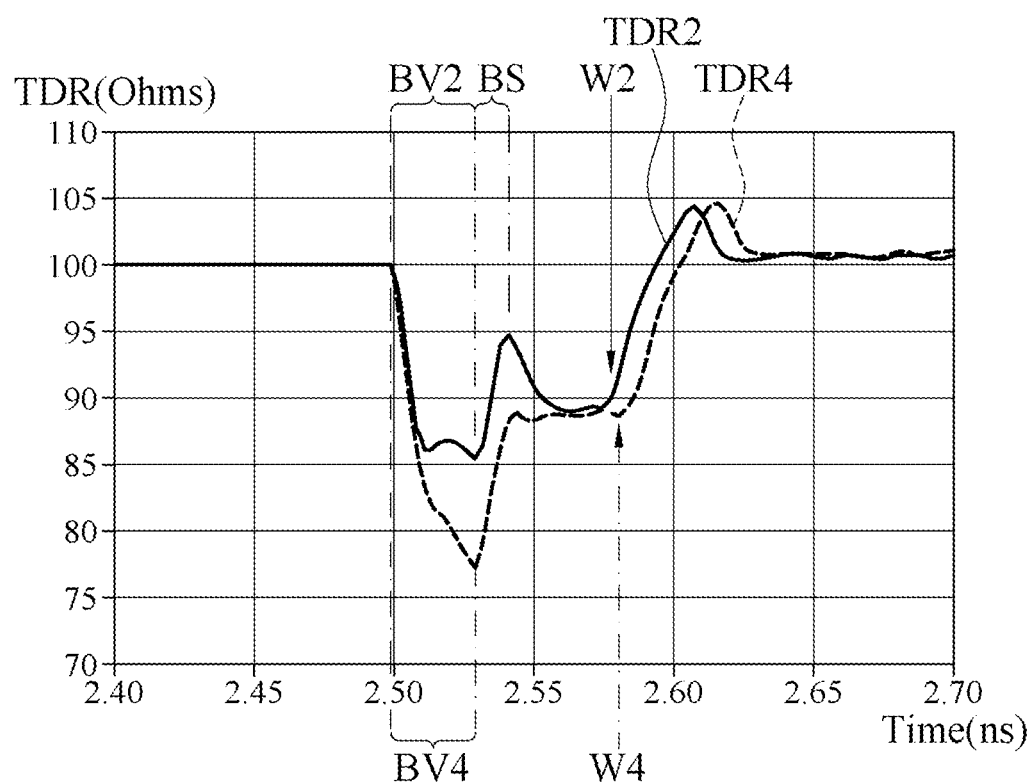
FIG. 8 is a differential time domain reflectometry (TDR) diagram of a pair of differential signal lines in FIG. 2 and FIG. 4.

FIG. 8 is a differential time domain reflectometry (TDR) diagram of a pair of differential signal lines in FIG. 2 and FIG. 4. In the figure, a horizontal axis represents time with a unit of nanosecond (ns, $10^{-9}$ seconds), and a vertical axis represents TDR impedance with a unit of ohm. TDR4 marked in FIG. 8 is a differential TDR curve TDR4 of the differential signal lines 69a and 69b in FIG. 4. An impedance of a time domain reflectometer is 100 ohms. A detection signal of the time domain reflectometer is inputted from the solder balls 30a and 30b and transmitted to the differential chip contacts 24a and 24b. That is, a start time of the horizontal axis of the differential TDR diagram is calculated when the detection signal is inputted from the solder balls 30a and 30b. A preset impedance (also referred to as a design impedance) of the differential signal lines 69a and 69b is 90 ohms. A BV4 interval (the horizontal axis is in an interval about 2.5 ns to 2.53 ns) marked in FIG. 8 reflects an impedance curve of the detection signal transmitted to the differential via holes 59a and 59b through the solder balls 30a and 30b. After the detection signal enters the differential signal lines 69a and 69b (after about 2.53 ns on the horizontal axis), the detected impedance rises to be close to the preset impedance of 90 ohms. A position of W4 marked in FIG. 8 represents a time point at which the detection signal leaves the differential substrate contacts 19a and 19b and enters the differential wire bonds 17a and 17b. It can be seen from the figure that, an impedance value of an interval between the solder balls 30a and 30b and the differential via holes 59a and 59b is at least about 77 ohms, which is about 13 ohms less than the preset impedance (90 ohms).

TDR2 marked in FIG. 8 is a differential TDR curve TDR2 of the differential signal lines 64a and 69b in FIG. 2. A detection signal of the time domain reflectometer is inputted from the solder balls 30a and 30b and transmitted to the differential chip contacts 24a and 24b. A preset impedance of the differential signal lines 64a and 69b of FIG. 2 is 90 ohms. A BV2 interval (the horizontal axis is in an interval of about 2.5 ns to 2.53 ns) marked in FIG. 8 reflects an impedance curve that the detection signal is transmitted to the differential via holes 54a and 54b through the solder balls 30a and 30b. A BS interval (the horizontal axis is in an interval of about 2.53 ns to 2.54 ns) marked in FIG. 8 reflects an impedance curve BS detected by the detection signal on the bifurcating sections 84a and 84b. After BS is marked. An impedance detected by the detection signal on the approaching sections 82a and 82b and the circuit trace sections 80a and 80b (after about 2.54 ns on the horizontal axis) is between BS and W2, and the detected impedance is close to the preset impedance of 90 ohms. A position of W2 marked in FIG. 8 represents a time point at which the detection signal leaves the differential substrate contacts 14a and 19b and enters the differential wire bonds 17a and 17b. It can be seen from the figure that, a distance between the differential via holes 54a and 54b of the embodiments of FIG. 2 is longer than a distance between the differential via holes 59a and 59b of the embodiments of FIG. 4. Therefore, the impedance of the differential via holes 54a and 54b in FIG. 2 is higher than that of the differential via holes 59a and 59b, so that the lowest impedance value of intervals between the solder balls 30a and 30b and the differential via holes 59a and 59b that are of the embodiments of FIG. 2 is about 86 ohms, and the highest impedance value is 95 ohms. The impedance value is between the positive and negative 5 ohms of the preset impedance (90 ohms). In this way, the impedance of intervals between the solder balls 30a and 30b and the differential via holes 59a and 59b that are of the embodiments of FIG. 2 is closer to the preset impedance than that in the embodiments of FIG. 4.

As can be known from the above, compared with the embodiments of FIG. 4, the embodiments of FIG. 2 have better electrical characteristics.

The chip 20 shown in FIG. 2 includes a plurality of pairs of differential chip contacts 24a and 24b, 26a and 26b, but not limited thereto during implementation, and the chip 20 may include only a pair of differential chip contacts 24a and 24b or 26a and 26b. Likewise, the substrate 10 may include only a pair of differential substrate contacts 14a, 14b or 16a, 16b, a pair of differential signal lines 64a, 64b or 66a, 66b, and a pair of differential via holes 54a, 54b or 56a, 56b.

Figure 9:
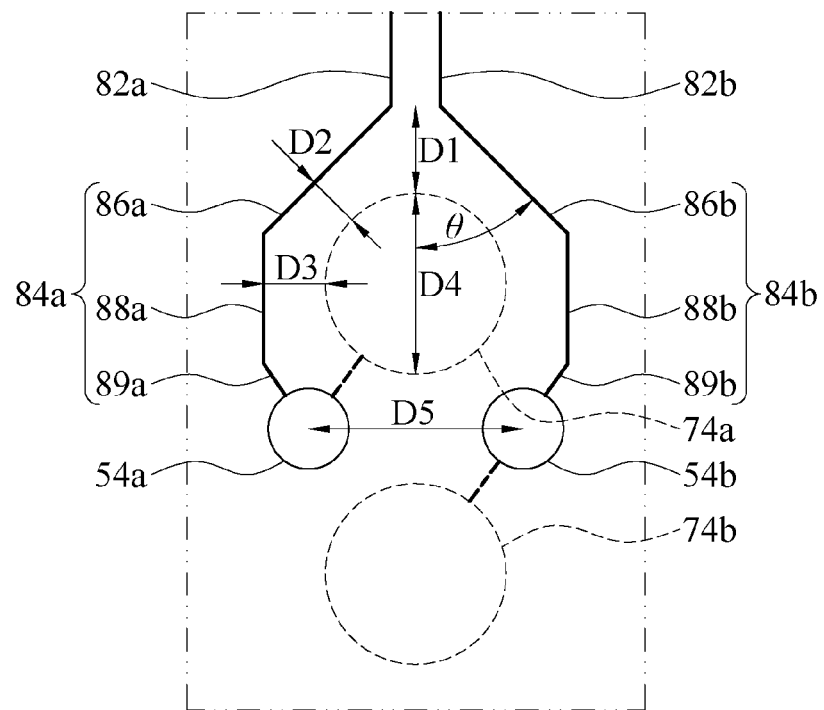
FIG. 9 is a partial enlarged view of a pair of differential signal lines according to some embodiments.

FIG. 9 is a partial enlarged view of a pair of differential signal lines according to some embodiments. In some embodiments, the bifurcating sections 84a and 84b are bifurcated from the approaching sections 82a and 82b to a direction away from the pad connection line L2 (see FIG. 2). A distance D1 (hereinafter referred to as a first distance) from joints of the bifurcating sections 84a, 84b and the (corresponding) approaching sections 82a, 82b to the differential solder ball pad 74a is about 100 μm to 250 μm. It can be seen from FIG. 3 that, the bifurcating sections 84a and 84b are located at a top layer of the substrate 10, and the differential solder ball pad 74a is located at a bottom layer of the substrate 10. The first distance D1 refers to, from a perspective (that is, the top view of FIG. 3) of FIG. 9, a distance from a center point of two joints between the bifurcating sections 84a, 84b and the approaching sections 82a, 82b along the pad connection line L2 to an edge of the differential solder ball pad 74a.

In some embodiments, each of the bifurcating sections 84a and 84b include an inclined subsection 86a, 86b, a straight subsection 88a, 88b, and an introduction subsection 89a, 89b. The inclined subsections 86a and 86b are respectively electrically connected to the approaching sections 82a and 82b. The straight subsections 88a and 88b are substantially parallel to the pad connection line L2. Two ends of the straight subsections 88a and 88b are respectively electrically connected to the inclined subsections 86a and 86b and the introduction subsections 89a and 89b. The introduction subsections 89a and 89b are respectively electrically connected to the differential via holes 54a and 54b.

In some embodiments, an included angle θ between each of the inclined subsections 86a, 86b and the pad connection line L2 is about 35 degrees to 55 degrees (for example, 45 degrees). Each of the inclined subsections 86a, 86b is about 50 μm to 150 μm (hereinafter referred to as a second distance D2) away from the adjacent differential solder ball pad 74a. Each straight subsection is about 50 μm to 150 μm (hereinafter referred to as a third distance D3) away from the adjacent differential solder ball pad. An outer diameter of each solder ball pad is about 300 μm to 600 μm (hereinafter referred to as a fourth distance D4). A distance between the differential via holes 54a and 54b is 70 μm to 600 μm (hereinafter referred to as a fifth distance D5). The second distance D2, third distance D3, fourth distance D4, and fifth distance D5 refer to the distances viewed from the perspective (that is, the top view of FIG. 3) of FIG. 9.

In some embodiments, the differential via holes 54a and 54b are located on a line passing through a midpoint of the pad connection line L2 and vertical to the pad connection lin L2 (L2 is a connection line of a center point of the differential solder ball pads 74a and 74b). Therefore, lengths of the connection lines that are respectively electrically connected between the via holes 54a, 54b and the differential solder ball pads 74a, 74b are substantially identical. Distances from pairs of differential substrate contacts 14a, 14b, 16a and 16b of the substrate 10 to the differential solder ball pads 74a, 74b, 76a and 76b are substantially identical, so that a time difference in transmitting a differential signal is reduced.

In some embodiments, referring to both FIG. 8 and FIG. 9, lengths of bifurcating sections 84a and 84b have a predetermined relationship with the fifth distance D5. The predetermined relationship makes an impedance of the two differential via holes 54a, 54b lower than a preset impedance (that is, design impedance) and an impedance of the two bifurcating sections 84a, 84b is higher than the preset impedance. As shown in FIG. 8, the impedance curve BV4 of the solder balls 30a, 30b and the differential via holes 54a, 54b that are of the embodiments of FIG. 4 is lower than the preset impedance, and is lower than the impedance curve BV2 of the embodiments of FIG. 2. In some embodiments, the impedance of the differential via holes 54a, 54b may be properly controlled by adjusting the distance (the fifth distance D5) between the differential via holes 54a and 54b. That is, the impedance of the differential via holes 54a and 54b is increased when the distance between the differential via holes 54a and 54b is increased. Besides, the bifurcating sections 84a and 84b are quasi-single-ended signal lines, and the impedance (that is, the impedance curve BS of FIG. 8) of the bifurcating sections 84a and 84b is higher than the preset impedance of the approaching sections 82a, 82b and the circuit trace sections 80a, 80b. Therefore, the impedance of the bifurcating sections 84a and 84b can be adjusted by adjusting the lengths of the bifurcating sections 84a and 84b. Longer length of the bifurcating sections 84a and 84b indicates higher impedance. In some embodiments, by adjusting the predetermined relationship between the length of the bifurcating sections 84a and 84b and the fifth distance D5, the impedance of the two differential via holes 54a and 54b is lower than the preset impedance (that is, the design impedance) and the impedance of the two differential bifurcating sections 84a and 84b is higher than the preset impedance (for example, the impedance curve between BV2 and BS in FIG. 8), to obtain better transmission quality of the differential signal line. Adjustment methods of the predetermined relationship, for example, but not limited to, adjustments of included angles θ between the inclined subsections 86a, 86b and the pad connection line L2, a second distance D2, a third distance D3, and included angles θ between the straight subsections 88a, 88b and the inclined subsections 86a and 86b, increase or decrease of lengths of the introduction subsections 89a, 89b (even removal of the entire introduction subsections 89a and 89b, which is to be described later) and the like. In addition, the lengths of the bifurcating sections 84a, 84b and upper and lower limits of the fifth distance D5 are constrained by the entire circuit traces on the substrate 10. For example, the bifurcating sections 84a and 84b need to keep a specification distance with the adjacent circuit traces, to maintain transmission quality of the bifurcating sections 84a and 84b and the adjacent circuit traces. In another example, the distance (the fifth distance D5) between the differential via holes 54a and 54b cannot be too short to maintain the quality of the signal transmitted by the differential via holes 54a and 54b. The fifth distance D5 cannot be so large that the differential via holes 54a and 54b are too close to the adjacent circuit traces, which affects the signal transmission quality.

Figure 10:
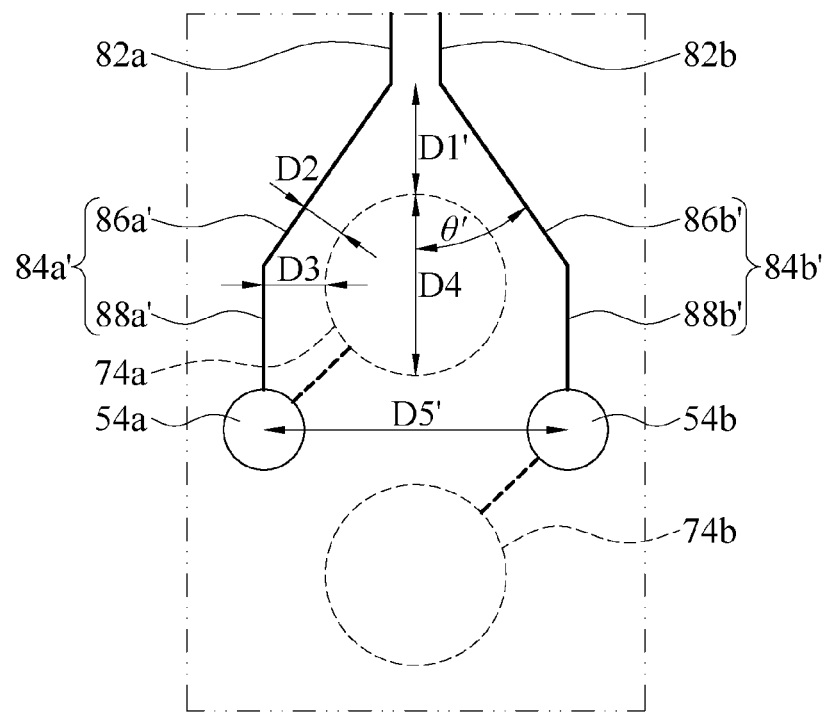
FIG. 10 is a partial enlarged view of a pair of differential signal lines according to some embodiments.

FIG. 10 is a partial enlarged view of a pair of differential signal lines according to some embodiments. In some embodiments, bifurcating sections 84a' and 84b' include inclined subsections 86a' and 86b', and straight subsections 88a' and 88b'. The inclined subsections 86a' and 86b' are respectively electrically connected to the approaching sections 82a and 82b. The straight subsections 88a' and 88b' are substantially parallel to the pad connection line L2 and respectively electrically connected to the differential via holes 54a and 54b. A fifth distance D5' of the embodiments in FIG. 10 is longer than the fifth distance D5 of the embodiments in FIG. 9, so that the bifurcating sections 84a' and 84b' of the embodiments in FIG. 10 does not have the introduction subsections 89a and 89b. Besides, included angles θ' between the inclined subsections 86a', 86b' and the pad connection line L2 that are of the embodiments in FIG. 10 are smaller than the included angles θ between the inclined subsections 86a, 86b and the pad connection line L2. In some embodiments, a length of a first distance D1' shown in FIG. 10 is longer than the length of the first distance D1 shown in FIG. 9. In some embodiments (not shown in the figure), the bifurcating sections 84a and 84b respectively include the inclined subsections 86a, 86b, and the introduction subsections 89a, 89b but not include the straight subsections 88a and 88b. That is, the inclined subsections 86a and 86b and the introduction subsections 89a and 89b are arranged in a rhombus shape.

Referring to FIG. 2 and FIG. 3, according to some embodiments, a package substrate 10 is adapted to package a chip 20, and the chip 20 has two differential chip contacts 24a and 24b. The package substrate 10 includes two differential substrate contacts 14a and 14b, two differential solder ball pads 74a and 74b, two differential via holes 54a and 54b, and two differential signal lines 64a and 64b. A connection line of the two differential substrate contacts 14a and 14b is a contact connection line L1, and the two differential substrate contacts 14a and 14b are adapted to electrically connect the two differential chip contacts 24a and 24b. A connection line of the two differential solder ball pads 74a and 74b is a pad connection line L2, and the contact connection line L1 is substantially perpendicular to the pad connection line L2. The two differential via holes 54a and 54b are substantially symmetrical about the pad connection line L2, and the two differential via holes 54a and 54b are respectively electrically connected to the two differential solder ball pads 74a and 74b. Each of the differential signal lines 64a and 64b includes circuit trace sections 80a and 80b, approaching sections 82a and 82b and bifurcating sections 84a and 84b connected in sequence. The two circuit trace sections 80a and 80b are respectively electrically connected to the two differential substrate contacts 14a and 14b and substantially arranged in parallel. The two approaching sections 82a and 82b are substantially arranged in parallel and substantially symmetrical about the pad connection line L2. The two bifurcating sections 84a and 84b are substantially symmetrical about the pad connection line L2 and respectively electrically connected to the two via holes 54a and 54b.

Therefore, when the package substrate 10 packages the differential chip contacts of the chip, the differential signal can be better transmitted.

In conclusion, in some embodiments, a differential signal line of a package substrate includes bifurcating sections. The bifurcating sections are symmetrical about a pad connection line and electrically connected to differential via holes, and the differential via holes are symmetrical about the pad connection line. Therefore, lengths of two differential signal lines in the same pair of differential signal lines are substantially the same, and a time difference in transmitting a differential signal is reduced. In some embodiments, impedances of the differential signal line and the differential via hole can be closer to a design impedance by adjusting a relationship between a length of the bifurcating section and a fifth distance.

What is claimed is:

1. A ball grid array package, comprising:
a chip, comprising two chip contacts; and
a substrate, comprising:
two substrate contacts, wherein a connection line of the two substrate contacts is a contact connection line, and the two chip contacts are electrically connected to the two substrate contacts;
two solder ball pads, wherein a connection line of the two solder ball pads is a pad connection line, and the contact connection line is insubstantially parallel to the pad connection line;
two via holes, wherein the two via holes are substantially symmetrical about the pad connection line, and the two via holes are respectively electrically connected to the two solder ball pads; and
two signal lines, wherein each signal line comprises a circuit trace section, an approaching section and a bifurcating section connected in sequence, the two circuit trace sections are respectively electrically connected to the two substrate contacts and substantially arranged in parallel, the two approaching sections are substantially arranged in parallel and substantially symmetrical about the pad connection line, and the two bifurcating sections are substantially symmetrical about the pad connection line and respectively electrically connected to the two via holes.

2. The ball grid array package according to claim 1, wherein a distance from a joint of the bifurcating section and the approaching section of each of the two signal lines to the solder ball pad is 100 μm to 250 μm.

3. The ball grid array package according to claim 2, wherein lengths of the two bifurcating sections are substantially identical.

4. The ball grid array package according to claim 3, wherein each of the two bifurcating sections comprises an inclined subsection and a straight subsection, the two inclined subsections are respectively electrically connected to the two approaching sections, and the two straight subsections are substantially parallel to the pad connection line and respectively electrically connected to the two via holes.

5. The ball grid array package according to claim 4, wherein an included angle between each of the two inclined subsections and the pad connection line is between 35 degrees and 55 degrees, a distance between the each of the two inclined subsections and the adjacent solder ball pad is 50 μm to 150 μm, a distance between each of the two straight subsections and the adjacent solder ball pad is 50 μm to 150 μm, and an outer diameter of the each of the two solder ball pads is 300 μm to 600 μm.

6. The ball grid array package according to claim 3, wherein the each of the two bifurcating sections sequentially comprises an inclined subsection, a straight subsection and an introduction subsection, the two inclined subsections are respectively electrically connected to the two approaching sections, the two straight subsections are substantially parallel to the pad connection line, and the two introduction subsections are respectively electrically connected to the two via holes.

7. The ball grid array package according to claim 6, wherein an included angle between each of the two inclined subsections and the pad connection line is between 35 degrees and 55 degrees, a distance between each of the two inclined subsections and the adjacent solder ball pad is 50 μm to 150 μm, a distance between each of the two straight subsections and the adjacent solder ball pad is 50 μm to 150 μm, and an outer diameter of each of the two solder ball pads is 300 μm to 600 μm.

8. The ball grid array package according to claim 7, wherein the two solder ball pads are close to one side of the substrate, and the pad connection line is substantially perpendicular to the side.

9. The ball grid array package according to claim 1, wherein the two signal lines have a preset impedance, and there is a predetermined relationship between a length of each of the two bifurcating sections and a distance between the two via holes, wherein the predetermined relationship makes an impedance of the two via holes be lower than the preset impedance and an impedance of the two bifurcating sections be higher than the preset impedance.

10. The ball grid array package according to claim 9, wherein the two solder ball pads are close to one side of the substrate, and the pad connection line is substantially perpendicular to the side of the substrate.

11. A package substrate, comprising:
two substrate contacts, wherein a connection line of the two substrate contacts is a contact connection line;
two solder ball pads, wherein a connection line of the two solder ball pads is a pad connection line, and the contact connection line is insubstantially parallel to the pad connection line;
two via holes, wherein the two via holes are substantially symmetrical about the pad connection line, and the two via holes are respectively electrically connected to the two solder ball pads; and
two signal lines, wherein each signal line comprises a circuit trace section, an approaching section and a bifurcating section connected in sequence, the two circuit trace sections are respectively electrically connected to the two substrate contacts and substantially arranged in parallel, the two approaching sections are substantially arranged in parallel and substantially symmetrical about the pad connection line, and the two bifurcating sections are substantially symmetrical about the pad connection line and respectively electrically connected to the two via holes.

12. The package substrate according to claim 11, wherein a distance from a joint of the bifurcating section and the approaching section of each of the two signal lines to the solder ball pad is 100 μm to 250 μm.

13. The package substrate according to claim 12, wherein lengths of the two bifurcating sections are substantially identical.

14. The package substrate according to claim 13, wherein each of the two bifurcating sections comprises an inclined subsection and a straight subsection, the two inclined subsections are respectively electrically connected to the two approaching sections, and the two straight subsections are substantially parallel to the pad connection line and respectively electrically connected to the two via holes.

15. The package substrate according to claim 14, wherein an included angle between each of the two inclined subsections and the pad connection line is between 35 degrees and 55 degrees, a distance between the each of the two inclined subsections and the adjacent solder ball pad is 50 μm to 150 μm, a distance between each of the two straight subsections and the adjacent solder ball pad is 50 μm to 150 μm, and an outer diameter of the each of the two solder ball pads is 300 μm to 600 μm.

16. The package substrate according to claim 13, wherein the each of the two bifurcating sections sequentially comprises an inclined subsection, a straight subsection and an introduction subsection, the two inclined subsections are respectively electrically connected to the two approaching sections, the two straight subsections are substantially parallel to the pad connection line, and the two introduction subsections are respectively electrically connected to the two via holes.

17. The package substrate according to claim 16, wherein an included angle between each of the two inclined subsections and the pad connection line is between 35 degrees and 55 degrees, a distance between each of the two inclined subsections and the adjacent solder ball pad is 50 μm to 150 μm, a distance between each of the two straight subsections and the adjacent solder ball pad is 50 μm to 150 μm, and an outer diameter of each of the two solder ball pads is 300 μm to 600 μm.

18. The package substrate according to claim 17, wherein the two solder ball pads are close to one side of the substrate, and the pad connection line is substantially perpendicular to the side of the substrate.

19. The package substrate according to claim 11, wherein the two signal lines have a preset impedance, and there is a predetermined relationship between a length of each of the two bifurcating sections and a distance between the two via holes, wherein the predetermined relationship makes an impedance of the two via holes be lower than the preset impedance and an impedance of the two bifurcating sections be higher than the preset impedance.

20. The package substrate according to claim 19, wherein the two solder ball pads are close to one side of the substrate, and the pad connection line is substantially perpendicular to the side.

\* \* \* \* \*